United States Patent
Lee et al.

(10) Patent No.: US 8,159,446 B2
(45) Date of Patent: Apr. 17, 2012

(54) GATE DRIVING CIRCUIT UTILIZING DUMMY STAGES AND LIQUID CRYSTAL DISPLAY HAVING THE SAME

(75) Inventors: Bong-Jun Lee, Seoul (KR); Kyung-wook Kim, Seoul (KR); Jong-oh Kim, Cheonan-si (KR); Sung-man Kim, Seoul (KR); Hong-woo Lee, Cheonan-si (KR); Hyuk-jin Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 840 days.

(21) Appl. No.: 11/869,197

(22) Filed: Oct. 9, 2007

(65) Prior Publication Data
US 2008/0266477 A1 Oct. 30, 2008

(30) Foreign Application Priority Data
Apr. 27, 2007 (KR) .................. 10-2007-0041563

(51) Int. Cl.
*G09G 3/36* (2006.01)
*G11C 19/00* (2006.01)
(52) U.S. Cl. ............... 345/100; 377/64; 377/77
(58) Field of Classification Search ........... 345/87–104; 377/64–81
See application file for complete search history.

(56) References Cited

U.S. PATENT DOCUMENTS

| 7,420,534 B2 * | 9/2008 | Yamashita et al. ........... 345/100 |
| 2006/0007085 A1 * | 1/2006 | Kim et al. .................. 345/87 |
| 2006/0022201 A1 * | 2/2006 | Kim et al. .................. 257/72 |
| 2006/0221042 A1 * | 10/2006 | Cho et al. .................. 345/100 |
| 2006/0267911 A1 * | 11/2006 | Jang .......................... 345/100 |
| 2007/0001991 A1 * | 1/2007 | Jang et al. .................. 345/100 |

* cited by examiner

*Primary Examiner* — Alexander Eisen
*Assistant Examiner* — Keith Crawley
(74) *Attorney, Agent, or Firm* — Cantor Colburn LLP

(57) ABSTRACT

A gate driving circuit has a first stage which includes: a pull-up driving unit which receives a first carry signal from a second stage and outputs a control signal having first, second, third and fourth voltages to a first node during a preliminary period, a gate active period, a first gate inactive period and a second gate inactive period, respectively; a pull-up unit which receives the control signal and outputs a gate-on signal to a second node during the gate active period; a carry output unit which receives the control signal and outputs a second carry signal to a third stage during the gate active period; and a pull-down unit which receives a gate-off signal and the second carry signal from the second stage and outputs the control signal having the fourth voltage level to the first node during the second gate inactive period.

19 Claims, 8 Drawing Sheets

GATE DRIVING CIRCUIT UTILIZING DUMMY STAGES AND LIQUID CRYSTAL DISPLAY HAVING THE SAME

This application claims priority to Korean Patent Application No. 10-2007-0041563, filed on Apr. 27, 2007, and all the benefits accruing therefrom under 35 U.S.C. §119, the contents of which in its entirety are herein incorporated by reference.

BACKGROUND OF THE INVENTION

1. Field of the Invention

The present invention relates to a gate driving circuit and a liquid crystal display having the gate driving circuit, and more particularly, to a gate driving circuit having a reduced size and a liquid crystal display having the same.

2. Description of the Related Art

In general, a liquid crystal display includes a liquid crystal panel having a common electrode display panel, a thin film transistor substrate and a liquid crystal layer interposed therebetween. The common electrode display panel has a common electrode and color filters disposed thereon, and the thin film transistor substrate has switching elements and pixel electrodes disposed thereon.

The liquid crystal panel further includes gate lines, data lines and pixels connected to the gate lines and the data lines. Furthermore, thin film transistors and a gate driving circuit which sequentially outputs gate signals to the gate lines are disposed on the liquid crystal panel.

The gate driving circuit generally includes a shift register having stages cascaded with one another. More specifically, a current stage supplies a gate signal to a corresponding gate line, and controls a previous stage and a subsequent stage.

Each stage includes switching elements and capacitors. The switching elements output the gate signals to the gate lines and account for approximately 20% of a size of the gate driving circuit. The gate driving circuit takes up a large space, relative to other components, in the liquid crystal panel, making it difficult to reduce a size of the liquid crystal display, thereby making it difficult to reduce a production margin and/or improve a production efficiency of the gate driving circuit and the liquid crystal panel having the same.

BRIEF SUMMARY OF THE INVENTION

In an exemplary embodiment of the present invention, a gate driving circuit has a reduced size.

Another exemplary embodiment of the present invention provides a liquid crystal display having a gate driving circuit which has a reduced size.

Exemplary embodiments of the present invention are not limited to those mentioned herein, and other exemplary embodiments of the present invention will be apparent to those having ordinary skill in the art.

A gate driving circuit according to an exemplary embodiment of the present invention includes a plurality of stages. At least one stage of the plurality of stages includes a first node, a second node and a pull-up driving unit which receives a first carry signal from a second stage or a start signal and outputs a control signal to the first node. The control signal has a first voltage level during a preliminary period, a second voltage level higher than the first voltage level during a gate active period subsequent and adjacent to the preliminary period, a third voltage level lower than the second voltage level and higher than the first voltage level during a first gate inactive period subsequent and adjacent to the gate active period and a fourth voltage level substantially equal to the first level during a second gate inactive period subsequent and adjacent to the first gate inactive period.

The at least the first stage of the plurality of stages further includes a pull-up unit which receives the control signal and a clock signal and outputs a gate-on signal to the second node during the gate active period, a carry output unit which receives the control signal and the clock signal and outputs a second carry signal to a third stage node during the gate active period, and a pull-down unit which receives a gate-off signal and the first carry signal of the second stage and outputs the control signal at the fourth voltage level to the first node during the second gate inactive period.

The pull-up unit includes a first switching element which outputs a gate-on signal pulled up by the clock signal to the second node in response to the control signal.

The pull-down unit consists of a second switching element which receives the first carry signal from the second stage and pulls down a voltage level of the first node, and an aspect ratio of the second switching element is in a range of about 1/20 through about 1/10 of an aspect ratio of the first switching element.

In an alternative exemplary embodiment, the pull-down unit includes a second switching element which receives the first carry signal from the second stage and pulls down a voltage level of the first node, and a third switching element which receives the first carry signal from the second stage and pulls down the voltage level of the second node. An aspect ratio of the third switching element is about 1/2 of an aspect ratio of the first switching element.

The gate driving circuit may further include a first shift register and a second shift register, each having a first stage, a second stage, a third stage and a fourth stage corresponding to a first gate line, a second gate line, a third gate line and a fourth gate line, respectively. The first stage, the second stage, the third stage and the fourth stage of each of the first shift register and the second shift register sequentially supply a first gate-on signal, a second gate-on signal, a third gate-on signal and a fourth gate-on signal, respectively, to the first gate line, the second gate line, the third gate line and the fourth gate line, respectively. The first stage of each of the first shift register and the second shift register receives the fourth gate-on signal output from the fourth stage of each of the first shift register and the second shift register and outputs a first gate-off signal to the first gate line.

Further, the first gate-on signal of each of the first shift register and the second shift register includes a preliminary charging period and a main charging period, and an application time of the second gate-on signal of each of the first shift register and the second shift register is delayed from an application time of the first gate-on signal of each of the first shift register and the second shift register by the preliminary charging period.

The first shift register is arranged in a substantially vertical direction and is disposed on a first side of an area having the first gate line, the second gate line, the third gate line and the fourth gate line disposed thereon, and the second shift register is arranged in the substantially vertical direction and is disposed on a second opposite side of the area having the first gate line, the second gate line, the third gate line and the fourth gate line disposed thereon.

The first shift register and the second shift register are simultaneously turned on, and the first shift register and the second shift register each may further include a first dummy stage, a second dummy stage and a third dummy stage.

In an alternative exemplary embodiment, the first shift register and the second shift register are sequentially turned on.

In yet another alternative exemplary embodiment, the gate driving circuit may include a first shift register having a first stage corresponding to a first gate line and a third stage corresponding to a third gate line, and a second shift register having a second stage corresponding to a second gate line and a fourth stage corresponding to a fourth gate line. The first stage, the second stage, the third stage and the fourth stage sequentially supply a first gate-on signal, a second gate-on signal, a third gate-on signal and a fourth gate-on signal, respectively, to the first gate line, the second gate line, the third gate line and the fourth gate line, respectively. The first stage receives the fourth gate-on signal output from the fourth stage and outputs a first gate-off signal to the first gate line. The first shift register is arranged in a substantially vertical direction and is disposed on a first side of an area having the first gate line, the second gate line, the third gate line and the fourth gate line disposed thereon, and the second shift register is arranged in the substantially vertical direction and is disposed on a second opposite side of the area having the first gate line, the second gate line, the third gate line and the fourth gate line disposed thereon. The first shift register and the second shift register are sequentially turned on.

According to another exemplary embodiment of the present invention, a liquid crystal display includes a liquid crystal panel. The liquid crystal panel includes first through n-th gate lines (where n is a natural number) and first through m-th data lines (where m is a natural number), a gate driving circuit including first through n-th stages corresponding to the first through n-th gate lines, and (n+1)-th through (n+3)-th stages not corresponding to the first through n-th gate lines, and a data driving circuit which supplies a data voltage to the first though m-th data lines. In the liquid crystal display, the first through (n+3)-th stages sequentially supply first through (n+3)-th gate-on signals, and an i-th stage (where 1≦i≦n) of the gate driving circuit receives the gate-on signal output from an (i+3)-th stage of the gate driving circuit and supplies a gate-off signal to the first gate line of the liquid crystal panel.

According to still another alternative exemplary embodiment of the present invention, a liquid crystal display includes a liquid crystal panel. The liquid crystal panel includes a first gate line, a second gate line, a third gate line and a fourth gate line, a first data line, a second data line, a third data line and a fourth data line, and pixels disposed at intersections of respective gate lines of the first gate line, the second gate line, the third gate line and the fourth gate line and respective data lines of the first data line, the second data line, the third data line and the fourth data line.

The liquid crystal display further includes a gate driving circuit having a first shift register disposed at a first side of each of the first gate line, the second gate line, the third gate line and the fourth gate line and a second shift register disposed at a second opposite side of each of the first gate line, the second gate line, the third gate line and the fourth gate line. The first shift register and the second shift register each have a first stage, a second stage, a third stage and a fourth stage corresponding to the first gate line, the second gate line, the third gate line and the fourth gate line, respectively, and a data driving circuit which supplies a data voltage to the first data line, the second data line, the third data line and the fourth data line.

In the liquid crystal display, the first stage, the second stage, the third stage and the fourth stage of each of the first shift register and the second shift register sequentially supply a first gate-on signal, a second gate-on signal, a third gate-on signal and a fourth gate-on signal to the first gate line, the second gate line, the third gate line and the fourth gate line, respectively, and the first stage of each of the first shift register and the second shift register receives the fourth gate-on signal output from the fourth stage of each of the first shift register and the second shift register and outputs a first gate-off signal to the first gate line.

The first shift register and the second shift register are simultaneously turned on or, in an alternative exemplary embodiment, the first shift register and the second shift register may be sequentially turned on.

According to yet another alternative exemplary embodiment of the present invention, a liquid crystal display includes a gate driving circuit having a plurality of stages, a data driving circuit which supplies a data voltage to the first through m-th data lines and a liquid crystal panel. The liquid crystal panel includes first through n-th gate lines (where n is a natural number) and first through m-th data lines (where m is a natural number). At least a first stage of the plurality of stages includes a first node and a second node and a pull-up driving unit which receives a first carry signal of a second stage or a start signal and outputs a control signal to the first node. The control signal has a first voltage level during a preliminary period, a second voltage level higher than the first voltage level during a gate active period subsequent and adjacent to the preliminary period, a third voltage level lower than the second voltage level and higher than the first voltage level during a first gate inactive period subsequent and adjacent to the gate active period, and a fourth voltage level substantially equal to the fourth voltage level during a second gate inactive period subsequent and adjacent to the first gate inactive period. The at least the first stage of the plurality of stages further includes a pull-up unit which receives the control signal and a clock signal and outputs a gate-on signal to the second node during the gate active period, a carry output unit which receives the control signal and the clock signal and outputs a second carry signal to a third stage during the gate active period, and a pull-down unit which a gate-off signal and the second carry signal of the second stage and outputs the control signal at the fourth voltage level to the first node during the second gate inactive period.

The pull-up unit includes a first switching element which outputs a gate-on signal pulled up by the clock signal to the second node in response to the control signal.

The pull-down unit consists of a second switching element which receives the first carry signal from the second stage and pulls down a voltage level of the first node, and an aspect ratio of the second switching element is in a range of about 1/20 through about 1/10 of an aspect ratio of the first switching element.

In an alternative exemplary embodiment, the pull-down unit includes a second switching element which receives the first carry signal from the second stage and pulls down a voltage level of the first node, and a third switching element which receives the first carry signal from the second stage and pulls down the voltage level of the second node. An aspect ratio of the third switching element is about 1/2 of an aspect ratio of the first switching element.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
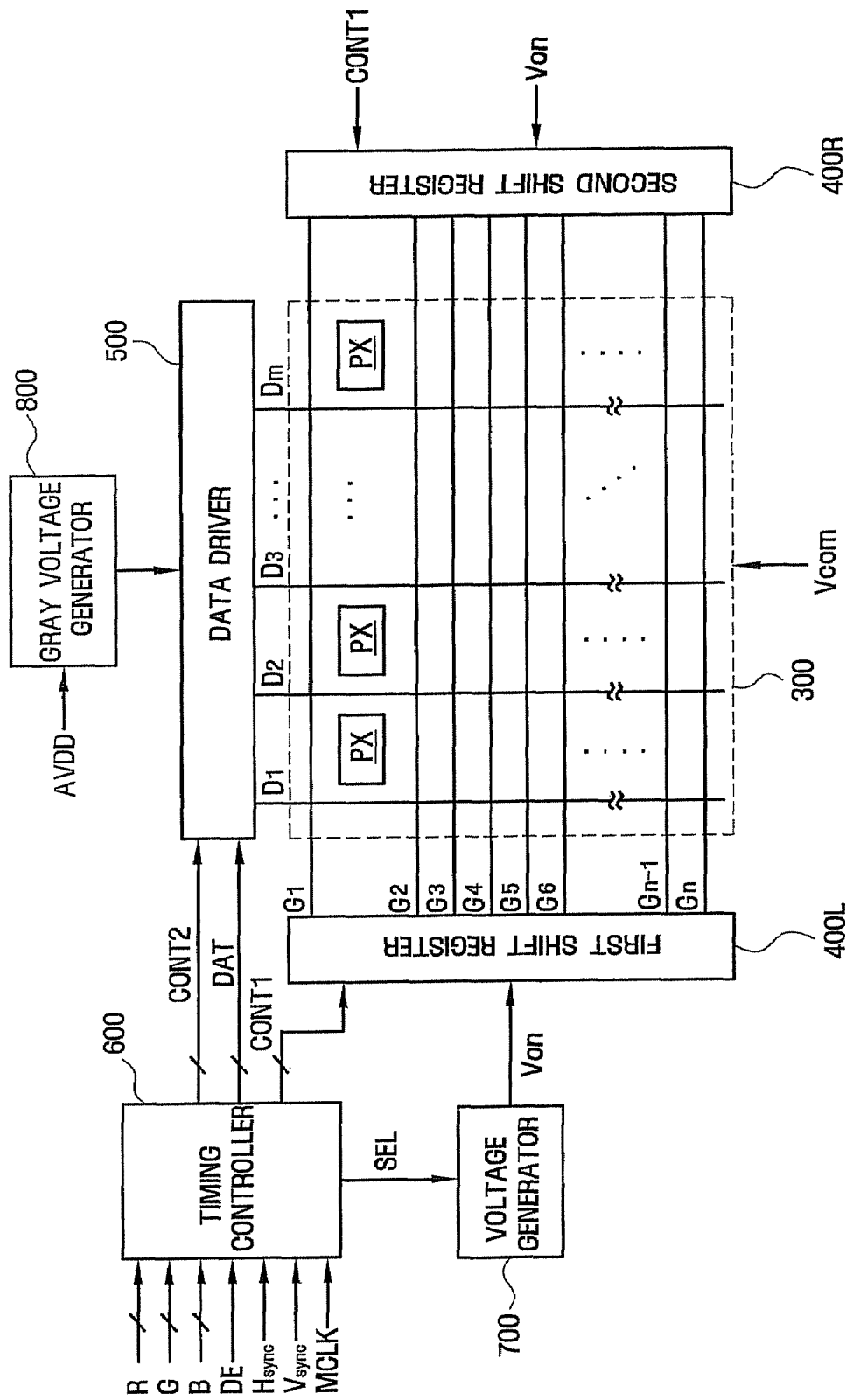
FIG. 1 is a block diagram of a liquid crystal display according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

The present invention will now be described in further detail with reference to the accompanying drawings, in which exemplary embodiments of the present invention are shown.

FIG. 1 is a block diagram of a liquid crystal display according to an exemplary embodiment of the present invention.

As shown in FIG. 1, a liquid crystal display according to an exemplary embodiment of the present invention includes a liquid crystal panel 300, a first shift register 400L and a second shift register 400R connected to the liquid crystal panel 300, a data driver 500, a gray voltage generator 800 connected to the data driver 500, a timing controller 600 which controls the above-mentioned components, for example, but is not limited thereto, and a voltage generator 700.

As shown in FIG. 1, the liquid crystal panel 300 includes a plurality of display signal lines $G_1$ through $G_n$ and $D_1$ through $D_m$ and a plurality of unit pixels PX connected to the plurality of display signal lines $G_1$ through $G_n$ and through $D_m$ and arranged in a substantially matrix pattern.

The plurality of display signal lines $G_1$ through $G_n$ and $D_1$ through $D_m$ includes a plurality of gate lines $G_1$ through $G_n$ which transmits gate signals and a plurality of data lines $D_1$ through $D_m$ which transmits data signals. Individual gate lines of the plurality of gate lines $G_1$ through $G_n$ extend in a first substantially row direction and are substantially parallel through each other, and individual data lines of the plurality of data lines $D_1$ to $D_m$ extend in a second substantially column direction and are substantially parallel to each other.

Each unit pixel PX of the plurality of unit pixels PX includes a switching element (not shown) connected to a respective gate line and a respective data line, a liquid crystal capacitor (not shown) connected to the switching element, and a storage capacitor (not shown). In alternative exemplary embodiments, the storage capacitor may be omitted.

To display color images, each unit pixel PX may display one of the primary colors, e.g., one of red, green and blue. In this case, red, green and blue color filters (not shown) are disposed in regions corresponding to a respective unit pixel electrode PX. In an exemplary embodiment, the color filters are disposed at corresponding regions on a second display panel (not shown), but the color filters may be provided above or below the unit pixel electrodes PX of a first display panel (not shown), for example, in alternative exemplary embodiments, but are not limited thereto.

A polarizer (not shown) which polarizes light is mounted on an outer surface of at least one of the first display panel (not shown) and the second display panel (not shown) of the liquid crystal panel 300.

The gray voltage generator 800 receives a supply voltage AVDD and generates a first gray voltage set and a second gray voltage set, each related to a desired transmittance of a unit pixel PX. The first gray voltage set may have a positive value with respect to a common voltage Vcom, and the second gray voltage group may have a negative value with respect to the common voltage Vcom, for example, but are not limited thereto. Further, the positive value and negative value gray voltages are alternately applied to the liquid display panel by the data driver 500 during inversion driving of the liquid crystal display according to an exemplary embodiment of the present invention.

As shown in FIG. 1, the first shift register 400L and the second shift register 400R are disposed at opposite sides of the liquid crystal panel 300 in the first direction, e.g., a substantially horizontal longitudinal direction, and are connected to the plurality of gate lines $G_1$ through $G_n$. The first shift register 400L and the second shift register 400R supply gate signals to the switching elements (not shown) through the plurality of gate lines $G_1$ through $G_n$.

The data driver 500 is connected to the plurality of data lines $D_1$ through $D_m$ of the liquid crystal panel 300, generates a plurality of gray voltages on the basis of the first gray voltage set and the second gray voltage set supplied from the gray voltage generator 800, selects a generated gray voltage from the plurality of gray voltages, and supplies the selected generated gray voltage to the unit pixels PX as a data signal. In general, the data driver 500 includes a plurality of integrated circuits, but is not limited thereto.

The timing controller 600 generates control signals which control operation of the first shift register 400L, the second shift register 400R, the data driver 500 and the voltage generator 700, and supplies the control signals thereto.

The voltage generator 700 generates a plurality of driving voltages, such as a first clock signal CKV1 (FIG. 2), a second clock signal CKV2 (FIG. 2) and a common voltage Vcom, for example, but is not limited thereto.

Operation of the liquid crystal display will now be described in further detail with reference to FIG. 1.

The timing controller 600 receives red, green and blue input image signals R, G and B, respectively, and input control signals for displaying the red, green and blue input image signals R, G and B, respectively, from an outside graphic controller (not shown). The following signals may be used as the input control signals, for example, but are not limited thereto: a vertical synchronization signal $V_{sync}$; a horizontal synchronization signal $H_{sync}$; a main clock signal MCLK; and a data enable signal DE. The timing controller 600 generates, for example, a gate control signal CONT1 and a data control signal CONT2, and processes the red, green and blue input image signals R, G, and B, respectively, based on an operational condition of the liquid crystal panel 300 and the input control signals to generate an image data signal DAT. The timing controller 600 transmits the gate control signal CONT1 to the first shift register 400L and the second shift register 400R, transmits the data control signal CONT2 and the image data signal DAT to the data driver 500, and transmits a voltage selection signal SEL to the voltage generator 700.

The gate control signal CONT1 includes a first start signal STV1 (FIG. 2) and a second start signal STV2 (FIG. 2) which initiate output of a gate-on signal Von (not shown) and an output enable signal OE (not shown) which defines a width of the gate-on signal Von.

The data control signal CONT2 includes a horizontal synchronization start signal STH (not shown) which initiates input of the image data signal DAT to the data driver 500, a data load signal TP (not shown) which allows data signals (not shown) to be transmitted to data lines of the plurality of data lines $D_1$ through $D_m$, a data clock signal HCLK (not shown) and an inversion signal RVS (not shown) which inverts a polarity of a data voltage. In an exemplary embodiment, the polarity of the data voltage is inverted with respect to the common voltage Vcom.

The data driver 500 receives the image data signal DAT corresponding to a given row of unit pixels PX in response to the data control signal CONT2 from the timing controller 600, selects appropriate gray voltages corresponding to the image data signal DAT from among the plurality of gray voltages, and thereby converts the image data signal DAT into corresponding data voltages.

The first shift register 400L and the second shift register 400R supply the gate-on signal Von to the plurality of gate lines $G_1$ through $G_n$ in response to the gate control signal CONT1 to turn on corresponding switching elements (not shown) connected to respective individual gate lines of the plurality of gate lines $G_1$ through $G_n$.

While the gate-on signal Von is supplied to a respective gate line of the plurality of gate lines $G_1$ through $G_n$ and a respective switching element connected to the respective gate line are in an on state, e.g., one horizontal period ("1H"), the data driver 500 supplies the data voltages to corresponding data lines of the plurality of data lines $D_1$ through $D_m$. The data voltages supplied to the corresponding data lines of the plurality of data lines $D_1$ through $D_m$ are applied to corresponding unit pixels PX through the switching elements in an on state.

An alignment of liquid crystal molecules in the a liquid crystal layer (not shown) of the liquid crystal panel 300 changes according to a variation in an electric field generated between the unit pixel electrodes PX and a common electrode (not shown), which causes a variation in a polarization of light passing through the liquid crystal layer. The variation in the polarization of light causes a variation in a transmittance of the light through the polarizer (not shown) to display one row of a desired image.

In a similar manner, the gate-on signal Von is sequentially applied to each gate line of the plurality of gate lines $G_1$ through $G_n$ such that the data voltages are applied to each row of the unit pixels PX during one frame to display one frame of a desired image. When the one frame has been displayed, display of a subsequent frame starts. In an exemplary embodiment, a state of the inversion signal RVS (not shown) applied to the data driver 500 is controlled such that a polarity of the data voltage applied to each unit pixel PX is opposite to a polarity of the data voltage applied to each unit PX in a previous frame (frame inversion). In alternative exemplary embodiments, a polarity of the data voltage applied to one data line may be inverted in the same frame according to the inversion signal RVS (line inversion), or polarities of the data voltages applied to a row of pixels may be different from each other (dot inversion).

The first shift register 400L and the second shift register 400R used in a gate driving circuit according to an exemplary embodiment of the present invention will now be described in further detail with reference to FIGS. 2 through 5.

Figure 2:
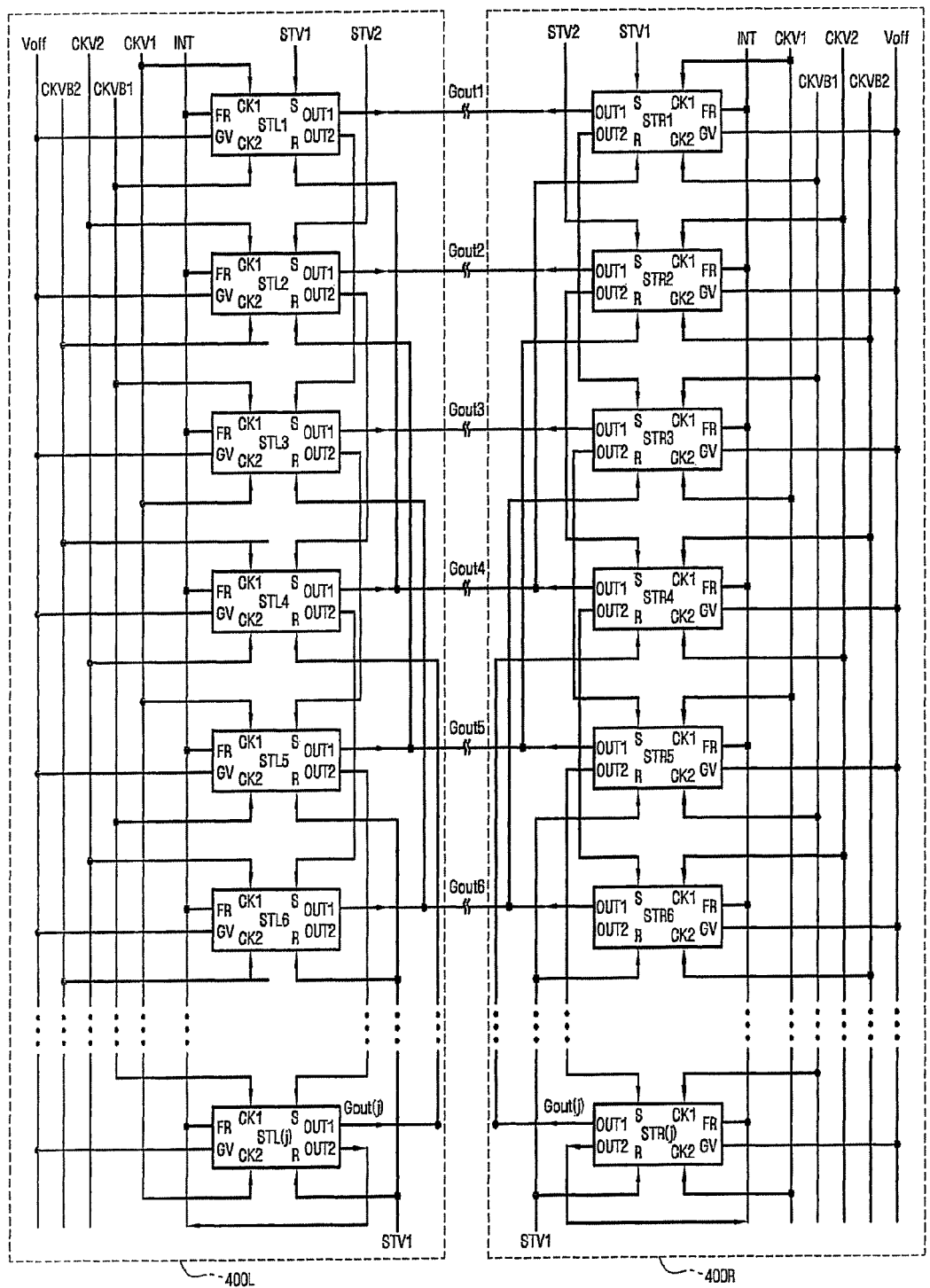
FIGS. 2 and 3 are block diagrams of shift registers of a gate driving circuit according to an exemplary embodiment of the present invention.
Figure 3:
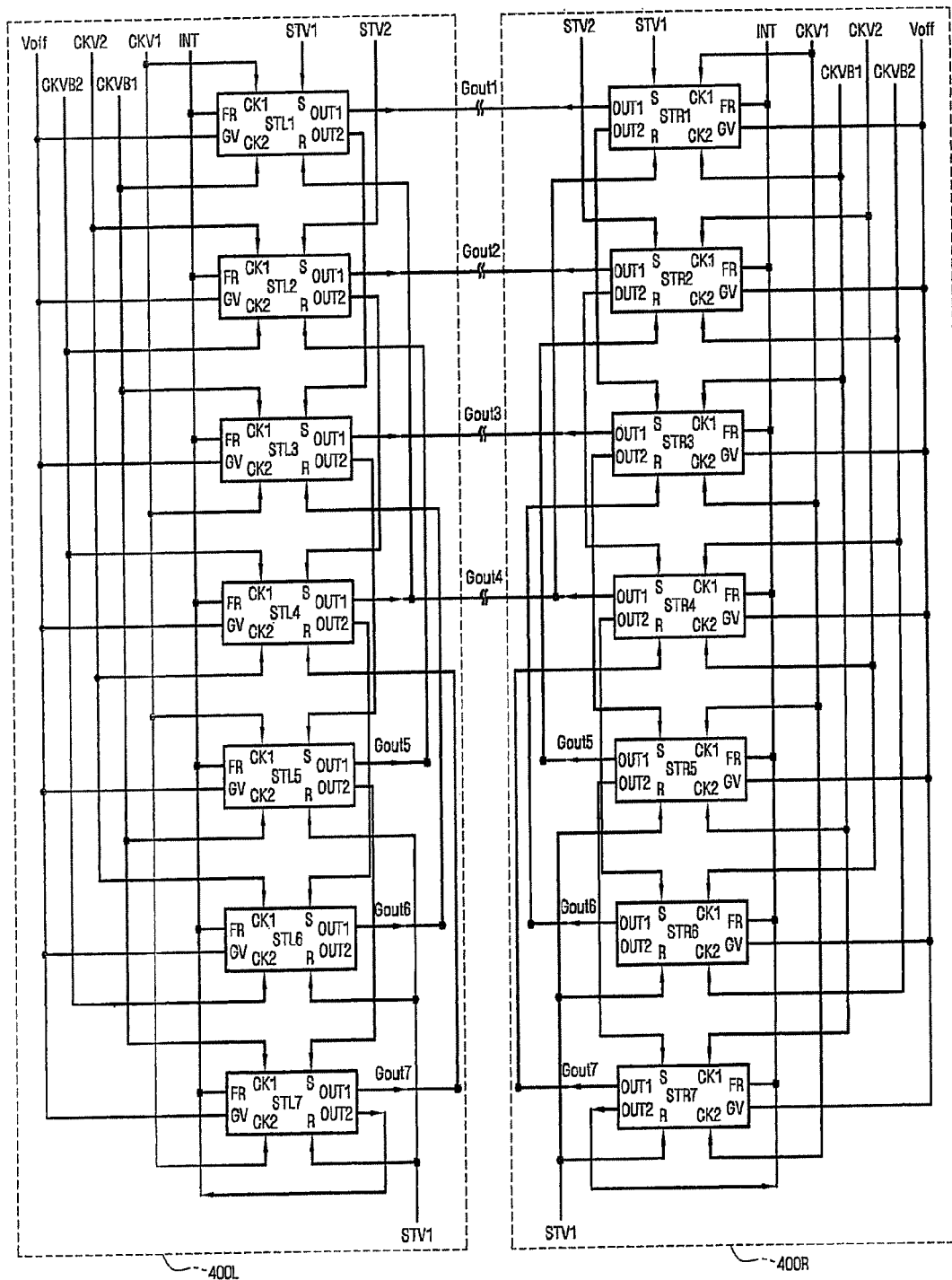
Figure 4:
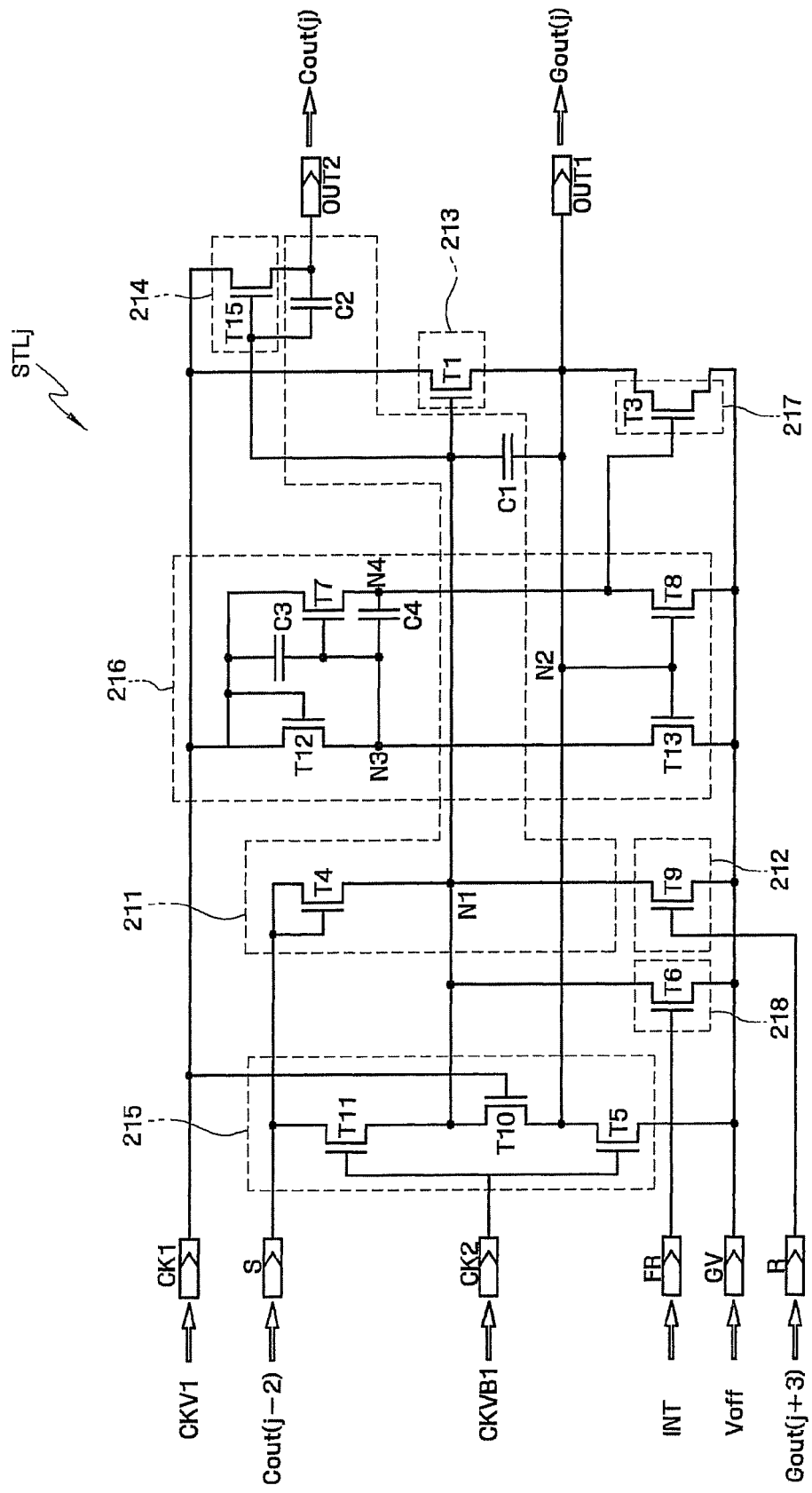
FIG. 4 is a schematic circuit diagram of an internal circuit structure of a stage of a shift register according to the exemplary embodiment of the present invention in FIG. 2.
Figure 5:
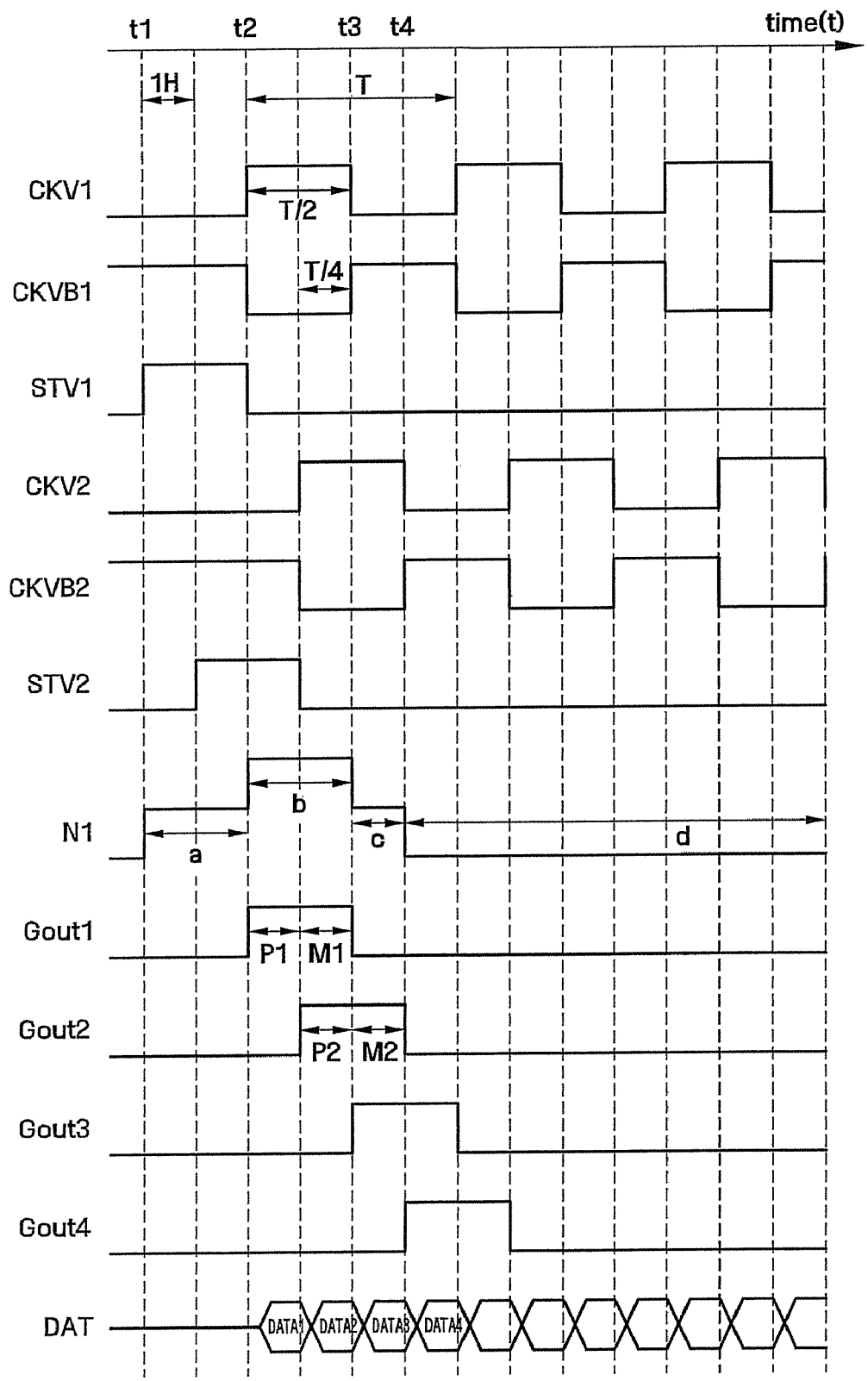
FIG. 5 is a signal waveform timing diagram illustrating operation of the stage of the shift register according to the exemplary embodiment of the present invention in FIG. 4.

FIGS. 2 and 3 are block diagrams of shift registers of a gate driving circuit according to an exemplary embodiment of the present invention, FIG. 4 is a schematic circuit diagram of a stage of a shift register according to the exemplary embodiment of the present invention in FIG. 2, and FIG. 5 is a signal waveform timing diagram illustrating operation of the stage of the shift register according to the exemplary embodiment of the present invention in FIG. 4.

Referring back to FIGS. 1 and 2, the first shift register 400L is connected to a first end of each gate line of the plurality of gate lines $G_1$ through $G_n$, and the second shift register 400R is connected to a second opposite end of each gate line of the plurality of gate lines $G_1$ through $G_n$. In an operation according to an exemplary embodiment of the present invention, the first shift register 400L and the second shift register 400R are simultaneously turned on and gate signals Gout1, Gout2, ..., Gout(j) output from the first shift register 400L and the second shift register 400R are thereby simultaneously supplied to the corresponding gate lines of the plurality of gate lines $G_1$ through $G_n$.

Referring to FIG. 2, the first shift register 400L includes a plurality of left stages STL1, STL2, ..., STL(j) which sequentially output the gate signals Gout1, Gout2, ..., Gout(j), and the second shift register 400R includes a plurality of right stages STR1, STR2, ..., STR(j) which also sequentially output the gate signals Gout1, Gout2, ..., Gout(j).

Odd-numbered left stages STL1, STL3, and STL5 of the plurality of left stages STL1, STL2, ..., STL(j) are cascaded to one another, and even-numbered left stages STL2, STL4, and STL6 of the plurality of left stages STL1, STL2, ..., STL(j) are cascaded to one another. Similarly, odd-numbered right stages STR1, STR3, and STR5 of the plurality of right stages STR1, STR2, ..., STR(j) are cascaded to one another, and even-numbered right stages STR2, STR4, and STR6 of the plurality of right stages STR1, STR2, ..., STR(j) are cascaded to one another.

In an exemplary embodiment of the present invention, the first shift register 400L and the second shift register 400R have substantially the same structure. Therefore, only the first shift register 400L will be described in further detail and a repetitive description of the second shift register 400R will be omitted below.

Referring to FIG. 2, each stage of the plurality of left stages STL1, STL2, ..., STL(j) includes a first clock terminal CK1, a second clock terminal CK2, a set terminal S, a reset terminal R, a power voltage terminal GV, a frame reset terminal FR, a gate output terminal OUT1 and a carry output terminal OUT2.

As shown in FIG. 2, a first clock signal CKV1, a first inverted clock signal CKVB1 and the gate-off signal Voff are supplied to odd-numbered left stages STL1, STL3 and STL5, while the first start signal STV1 is applied to an odd-numbered left stage STL1. A second clock signal CKV2, a second inverted clock signal CKVB2 and the gate-off signal Voff are supplied to even-numbered left stages STL2, STL4 and STL6, while the second start signal STV2 is supplied to an even-numbered stage STL2.

The first inverted clock signal CKVB1 has phase which is inverted with respect to a phase of the first clock signal CKV1, and the second inverted clock signal CKVB2 has a phase which is inverted with respect to a phase of the second clock signal CKV1. Further, the second clock signal CKV2 is delayed from the first clock signal CKV1 by one quarter ("T/4") of one period ("T") of the first clock signal CKV1, and the first inverted clock signal CKVB1 is delayed from the second inverted clock signal CKVB2 by one quarter ("T/4") of one period ("T") of the second inverted clock signal CKVB2, as shown in FIG. 5.

Instead of a carry signal of a previous stage, the first start signal STV1 is input to the set terminal S of the first left stage STL1, and the second start signal STV2 is input to the set terminal S of the second left stage STL2, as shown in FIG. 2. The second start signal STV2 is delayed from the first start signal STV1 by one quarter ("T/4") of one period ("T") of the first start signal STV1, as shown in FIG. 5.

Similarly, instead of a gate signal for the a last stage STL(j), the first start signal STV1 is input to the reset terminal R of the last stage STL(j), as shown in FIG. 2.

Still referring to FIG. 2, in the third left stage STL3 on the left side, for example, a carry signal of a previous stage, e.g., the first left stage STL1, and a gate signal Gout6 of a subsequent stage, e.g., the sixth left stage STL6, are input to the set terminal S and the reset terminal R, respectively, of the third left stage STL3, and the first inverted clock signal CKVB1 and the first clock signal CKV1 are input to the first clock terminal CK1 and the second clock terminal CK2, respectively, of the third left stage STL3. In addition, the gate-off signal Voff is input to the power voltage terminal GV, and an initial signal INT is input to the frame reset terminal FR of the third left stage STL3. Finally, a gate output terminal OUT1 outputs a gate signal Gout3, and the carry output terminal OUT2 outputs a carry signal supplied to a set terminal S of the fifth left stage STL5.

A carry signal of the last left stage STL(j) is supplied to the frame reset terminal FR of each left stage of the plurality of left stages STL1, STL2, ..., STL(j) as the initial signal INT.

For purposes of explanation, a block diagram of a shift register having seven stages, e.g., j=7, is shown in FIG. 3, but alternative exemplary embodiments of the present invention are not limited thereto.

Referring to FIGS. 1 and 3, left stages STL1, STL2, STL3 and STL4 supply gate signals Gout1, Gout2, Gout3 and Gout4 to the gate lines $G_1$, $G_2$, $G_3$ and $G_4$, respectively. Dummy left stages STL5, STL6 and STL7 output gate signals Gout5, Gout6 and Gout7, which are supplied to the left stages STL2, STL3 and STL4, respectively.

Further, the gate signal Gout4 of the left stage STL4 is input to a reset terminal R of the left stage STL1, and the gate signal Gout6 of the left stage STL6 is input to a reset terminal R of the left stage STL3. The gate signal Gout5 of the left stage STL5 is input to a reset terminal R of the left stage STL2 and the gate signal Gout7 of the left stage STL7 is input to a reset terminal R of the left stage STL4. Thus, gate signals of even-numbered left stages STL2, STL4 and STL6 are input to reset terminals R of odd-numbered left stages STL1, STL3, STL5 and STL7, respectively, and gate signals of the odd-numbered left stages STL1, STL3, STL5 and STL7 are input to reset terminals R of the even-numbered left stages STL2, STL4 and STL6, respectively. Therefore, in an exemplary embodiment of the present invention, it is possible to adjust a reset time of each stage.

An internal circuit of each stage of the first shift register 400L and the second shift register 400R will be now described in further detail with reference to FIG. 4.

As noted above, the first shift register 400L and the second shift register 400R have substantially the same structure. Therefore, only the first shift register 400L will be described in further detail and a repetitive description of the second shift register 400R will be omitted below.

Referring to FIG. 4, each stage, e.g., a stage STL(j), includes a pull-up driving unit 211, a pull-down unit 212, a pull-up unit 213, a carry output unit 214, a ripple preventing unit 215, a switching unit 216, a holding unit 217 and a reset unit 218.

The pull-up driving unit 211 includes a switching element T4, a first capacitor C1 and a second capacitor C2. A gate and a source of the switching element T4 are each connected to a set terminal S, and a drain thereof is connected to a first node N1. The first capacitor C1 is connected between the first node N1 and a second node N2, and the second capacitor C2 is connected between the first node N1 and a carry output terminal OUT2.

The pull-down unit 212 includes a switching element T9 having a gate connected to a reset terminal R, a source connected to a power voltage terminal GV and a drain connected to the first node N1.

The pull-up unit 213 includes a switching element T1 having a gate connected to the first node N1, a source connected to the first clock terminal CK1 and a drain connected to the gate output terminal OUT1 through the second node N2. In operation, the pull-up unit 213 outputs to the gate output terminal OUT1 a gate signal Gout(j) pulled up to the gate-on signal Von by a first clock signal CKV1 supplied through the first clock terminal CK1.

In an exemplary embodiment of the present invention, an aspect ratio of the switching element T9 may be in a range of about 1/20 through about 1/10 of an aspect ratio of the switching element T1.

The carry output unit 214 includes a switching element T15 having a gate connected to the first node N1, a source connected to the first clock terminal CK1 and a drain connected to the carry output terminal OUT2. In operation, the carry output unit 214 outputs a carry signal Cout(j) pulled up by the clock signal CKV1 supplied through the first clock terminal CK1 to the carry output terminal OUT2.

The ripple preventing unit 215 includes switching elements T11, T10 and T5 connected in series between the set terminal S and the power voltage terminal GV. More specifically, the switching element T11 has a gate connected to a second clock terminal CK2, a source connected to the set terminal S and a drain connected to the first node N1. The switching element T10 has a gate connected to the first clock terminal CK1, a source connected to the second node N2 and a drain connected to the first node N1. The switching element T5 has a gate connected to the second clock terminal CK2, a source connected to the power voltage terminal GV and a drain connected to the second node N2.

The switching element T10 supplies a signal from the second node N2 to the first node N1 in response to the first clock signal CKV1 to prevent a ripple of the gate signal Gout(j) output from the gate output terminal OUT1. The switching element T11 supplies a carry signal from a different stage, e.g., a previous stage carry signal Cout(j−2), to the first node N1 in response to a first inverted clock signal CKVB1 supplied through the second clock terminal CK2 to further prevent the ripple of the gate signal Gout(j) output from the gate output terminal OUT1. In addition, the switching element T5 supplies a gate-off signal Voff to the second node N2 in response to the first inverted clock signal CKVB1 supplied through the second clock terminal CK2 to prevent the ripple of the gate signal Gout(j) output from the gate output terminal OUT1.

The switching unit 216 includes switching elements T12, T7, T13 and T18, a third capacitor C3 and a fourth capacitor C4, and turns a switching element T3 of the holding unit 217 on or off.

More specifically, the switching element T12 has a gate and a source connected to the first clock terminal CK1 and a drain connected to a third node N3. The switching element T7 has a gate connected to the third node N3, a source connected to the first clock terminal CK1 and a drain connected to a fourth node N4. The third capacitor C3 is connected between the first clock terminal CK1 and the third node N3, and the fourth capacitor C4 is connected between the third node N3 and the fourth node N4. The switching elements T13 and T8 each have a gate connected to the second node N2, a source connected to the power voltage terminal GV and a drain connected to the third node N3 and the fourth node N4, respectively.

When the switching elements T12 and T7 are turned on in response to the first clock signal CKV1, the first clock signal CKV is supplied to the third and fourth nodes N3 and N4, so that a high-level gate signal Gout(j), e.g., the gate-on signal Von, is outputted from the gate output terminal OUT1. Then, the switching elements T13 and T8 are turned on, and the voltage levels of the third node N3 and the fourth node N4 are lowered to a low-level, e.g., to the gate-off signal Voff. Thus, the switching element T3 of the holding unit 217 is kept in an off state.

Subsequently, when a low-level gate signal Gout(j), e.g., a gate-off signal Voff, is output from the gate output terminal OUT1, the switching elements T13 and T8 are each turned off. The switching elements T12 and T7 are then turned on, and a high-level first clock signal CKV1 is supplied to the fourth node N4 and the switching element T3 outputs the gate-off signal Voff as a gate signal Gout(j) to the gate output terminal OUT1 in response to the clock signal CKV1. Therefore, the gate-off signal Voff is output from the gate output terminal OUT1.

The holding unit 217 is connected to the switching unit 216 via the fourth node N4 and includes the switching element T3 having a gate connected to the fourth node N4, a source connected to the power voltage terminal GV and a drain connected to the gate output terminal OUT1, e.g., node N2.

The reset unit 218 is connected to the pull-up driving unit 211 via the first node N1, and includes a switching element T6 having a gate connected to the frame reset terminal FR, a source connected to the power voltage terminal GV and a drain connected to the first node N1. The switching element T6 discharges noise input through the set terminal to the gate-off signal Voff in response to the previous carry signal Cout(j−2) of the previous stage. Therefore, the gate-off signal Voff is output to the second node N2, and the switching elements T1 and T15 are turned off to reset the gate output terminal OUT1 and the carry output terminal OUT2.

Operation an internal circuit of each stage of the first shift register 400L and the second shift register 400R will now be described in further detail with reference to FIGS. 4 and 5.

As shown in FIG. 5, a gate signal Gout1 supplied to a first gate line $G_1$ includes a preliminary charge period P1 and a main charge period M1, and a gate signal Gout2 supplied to a second gate line G2 is delayed from the gate signal Gout1 by the preliminary charge period P1.

Referring to FIGS. 4 and 5, when the switching element T4 of the pull-up driving unit 211 is turned on in response to the first start signal STV1 (FIGS. 2 and 3) or a carry signal of a different stage, e.g., Cout(j−2) (FIG. 4), at a time t1, the first capacitor C1 and the second capacitor C2 are charged. Therefore, the first node N1 has a first voltage level during a preliminary period "a" maintained for 2H, e.g., until a time t2.

At the time t2, the switching element T4 of the pull-up driving unit 211 is turned off and the first node N1 is thereby floated, and the first clock signal CKV1 at a high level is supplied to the first clock terminal CK1 to turn on the switching element T1 of the pull-up unit 213 and the switching element T15 of the carry output unit 214. Therefore, the clock signal CKV1 supplied to the first clock terminal CK1 is output as the gate signal Gout(j) and the carry signal Cout(j) from the gate output terminal OUT1 and the carry output terminal OUT2, respectively. At this time, the switching element T1 is turned on, and the first node N1 has a second voltage level higher than the first voltage level during a gate active period "b" maintained for 2H.

At a time t3, the switching element T1 is still at an on state, and the clock signal CKV1 supplied to the first clock terminal CK1 is output as the gate signal Gout(j) from the gate-output terminal OUT1. At that time, the first node N1 has a third voltage level lower than the second voltage level during a first gate inactive period "c" maintained for 1H. The first gate inactive period "c" is a period before a gate signal Gout(j+3) of a subsequent stage is input to the gate of the switching element T9 of the pull-down unit 212.

At a time t4, the switching element T9 is turned on in response to the gate signal Gout(j+3) of a subsequent stage being applied to the gate of the switching element T9, the first node N1 has a fourth voltage level lower than the third voltage level, e.g., a level substantially equal to that of the gate-off signal Voff, during a second gate inactive period "d". At that time, charges stored in the first and second capacitors C1 and C2 are discharged to the gate-off signal Voff by the turned-on switching element T9.

As described above, according to an exemplary embodiment of the present invention, a gate signal Gout(j+3) of a subsequent stage is supplied to a reset terminal R of a j-th stage, .e.g., STL(j), and a first node of the stage STL(j) thereby has a constant voltage level during a first gate inactive period when a switching element T1 outputs a gate-off signal to a second node. Therefore, a switching element T9 serves as a single switching element, effectively reducing an area of a gate driving circuit in a liquid crystal panel by removing any additional switching elements which would otherwise occupy an additional area of the gate driving circuit.

Figure 6:
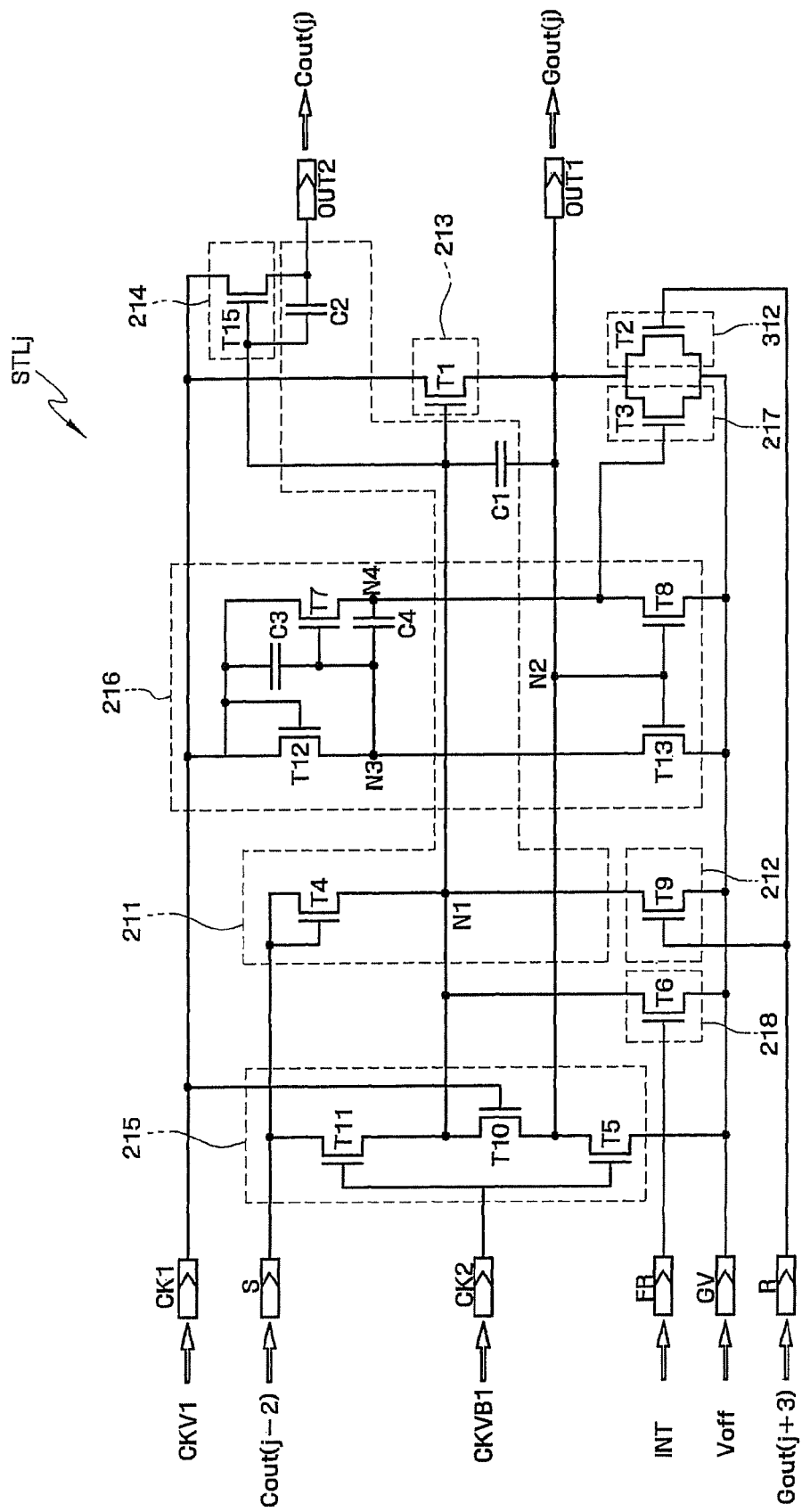
FIG. 6 is a schematic circuit diagram of an internal circuit structure of a stage of a shift register according to an alternative exemplary embodiment of the present invention.

FIG. 6 is a schematic circuit diagram of an internal circuit structure of a stage of a shift register according to an alternative exemplary embodiment of the present invention.

Referring to FIG. 6, each stage, e.g., a stage STL(j), includes a pull-up driving unit 211, a pull-down unit 212, a supplementary pull-down unit 312, a pull-up unit 213, a carry output unit 214, a ripple preventing unit 215, a switching unit 216, a holding unit 217 and a reset unit 218.

The stage STL(j) according to an alternative exemplary embodiment of the present invention, hereinafter described in further detail with reference to FIG. 6, is substantially the same as that of the exemplary embodiment described above with reference to FIG. 4, except for the supplementary pull-down unit 312. Therefore, the same or like components have the same labels in FIGS. 4 and 6, and any repetitive description thereof will be omitted below.

The supplementary pull-down unit 312 includes a switching element T2 having a gate connected to a reset terminal R to receive a gate signal Gout(j+3) from a subsequent stage STL(j+3), a source connected to a power voltage terminal GV and a drain connected to a gate output terminal OUT1, e.g., a node N2.

An aspect ratio of the switching element T2 may be less than or equal to about 1/2 of an aspect ratio of a switching element T1 of the pull-up unit 213.

Operation of the stage STL(j) having the supplemental pull-down unit 312 according to an alternative exemplary embodiment will now be described in further detail with reference to FIGS. 5 and 6.

Referring to FIGS. 5 and 6, when a switching element T4 of the pull-up driving unit 211 is turned on in response to a first start signal STV1 (FIGS. 2 and 3) or a carry signal, e.g., Cout(j−2) (FIG. 6) of a previous stage at a time t1, a first capacitor and a second capacitor C2 are charged. Therefore, a first node N1 has a first voltage level during a preliminary period "a" maintained for 2H, e.g., until a time t2.

At the time t2, the switching element T4 of the pull-up driving unit 211 is turned off, and the first node N1 is thereby floated, and a first clock signal CKV1 at a high level is supplied to the first clock terminal CK1 to turn on a switching element T1 of the pull-up unit 213 and a switching element T15 of the carry output unit 214. Therefore, the clock signal CKV1 supplied to the first clock terminal CK1 is output as a gate signal Gout(j) and a carry signal Cout(j) from a gate output terminal OUT1 and a carry output terminal OUT2, respectively. At this time, the switching element T1 is turned on, and the first node N1 has a second voltage level higher than the first voltage level during a gate active period "b" maintained for 2H.

At a time t3, the switching element T1 is still at an on state, and the clock signal CKV1 supplied to the first clock terminal CK1 is output as a gate signal Gout(j) from the gate-output terminal OUT1. At that time, the first node N1 has a third voltage level lower than the second voltage level during a first gate inactive period "c" is maintained for 1H. The first gate inactive period "c" is a period before a gate signal Gout(j+3) of a subsequent stage is input to the gate of a switching element T9 of the pull-down unit 212 and the switching element T2 of the supplementary pull-down unit 312.

At a time t4, the switching element T9 of the pull-down unit 212 is turned on in response to the gate signal Gout(j+3) of a subsequent stage, and the first node N1 thereby has a fourth voltage level lower than the third voltage level, e.g., a level equal to a level of a gate-off signal Voff, during a second gate inactive period "d". Furthermore, at the time t4, the switching element T2 of the supplementary pull-down unit 312 is turned on in response to the gate signal Gout(j+3) of the subsequent stage, and the second node N2 thereby has the fourth voltage level lower than the third voltage level, e.g., a voltage level equal to the level of the gate-off signal Voff, during the second gate inactive period "d". Thus, charges stored in the first capacitor C1 and the second capacitor C2 are discharged to the gate-off signal Voff by the switching element T9 of the pull-down unit 212 and the switching element T2 of the supplemental pull-down unit 312.

As described above, according to an alternative exemplary embodiment of the present invention, an area of a gate driving circuit in a liquid crystal panel is effectively reduced by reducing a size of the switching element T2 to have an aspect ratio less than or equal to about 1/2 of an aspect ratio of the switching element T1. Thus a production yield of the gate driving circuit is thereby effectively improved, resulting in substantially improved production efficiency and reduced production cost of a liquid crystal display having the gate driving circuit.

Figure 7:
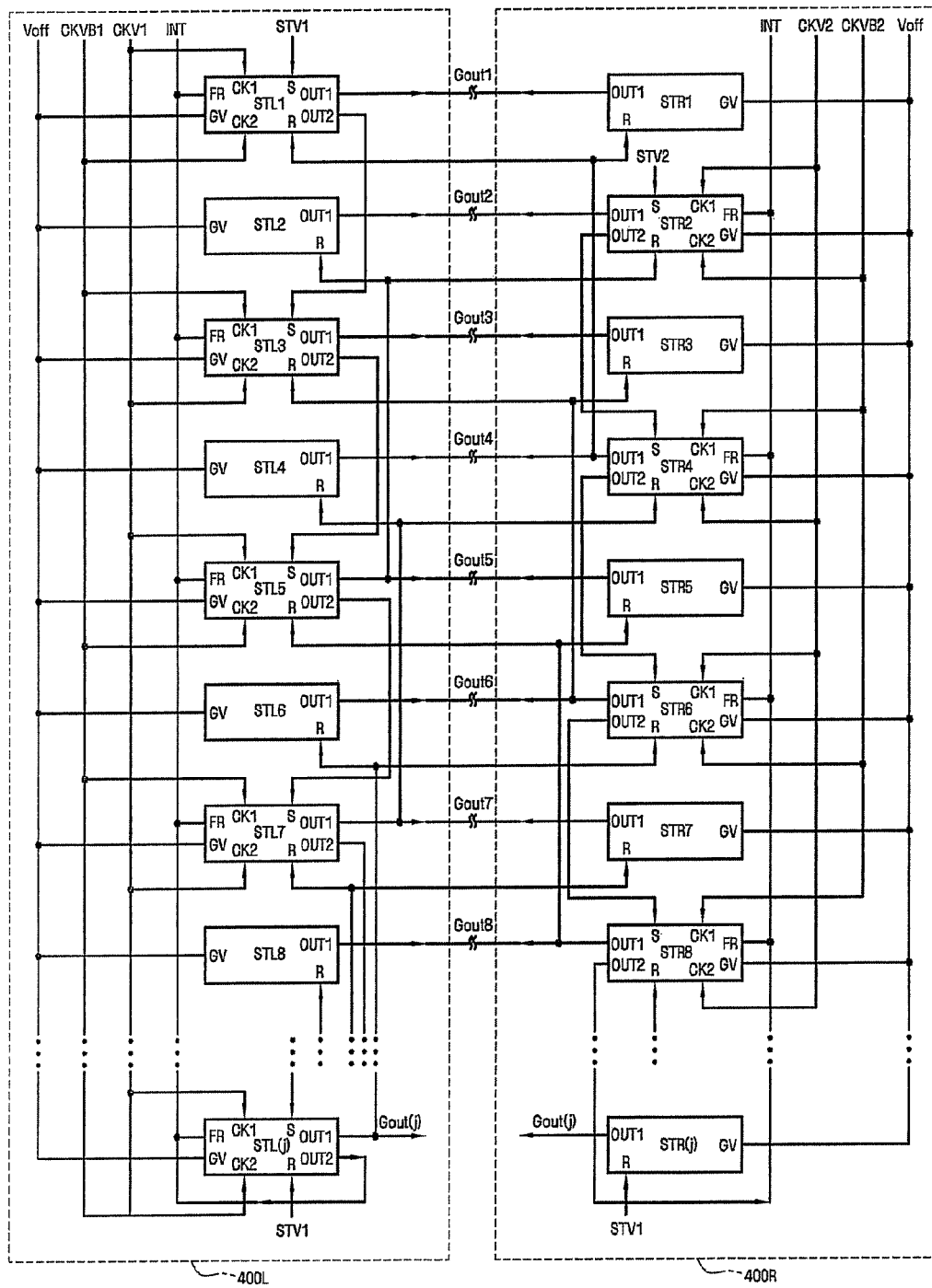
FIGS. 7 and 8 are block diagrams of shift registers of a gate driving circuit according to an alternative exemplary embodiment of the present invention.
Figure 8:
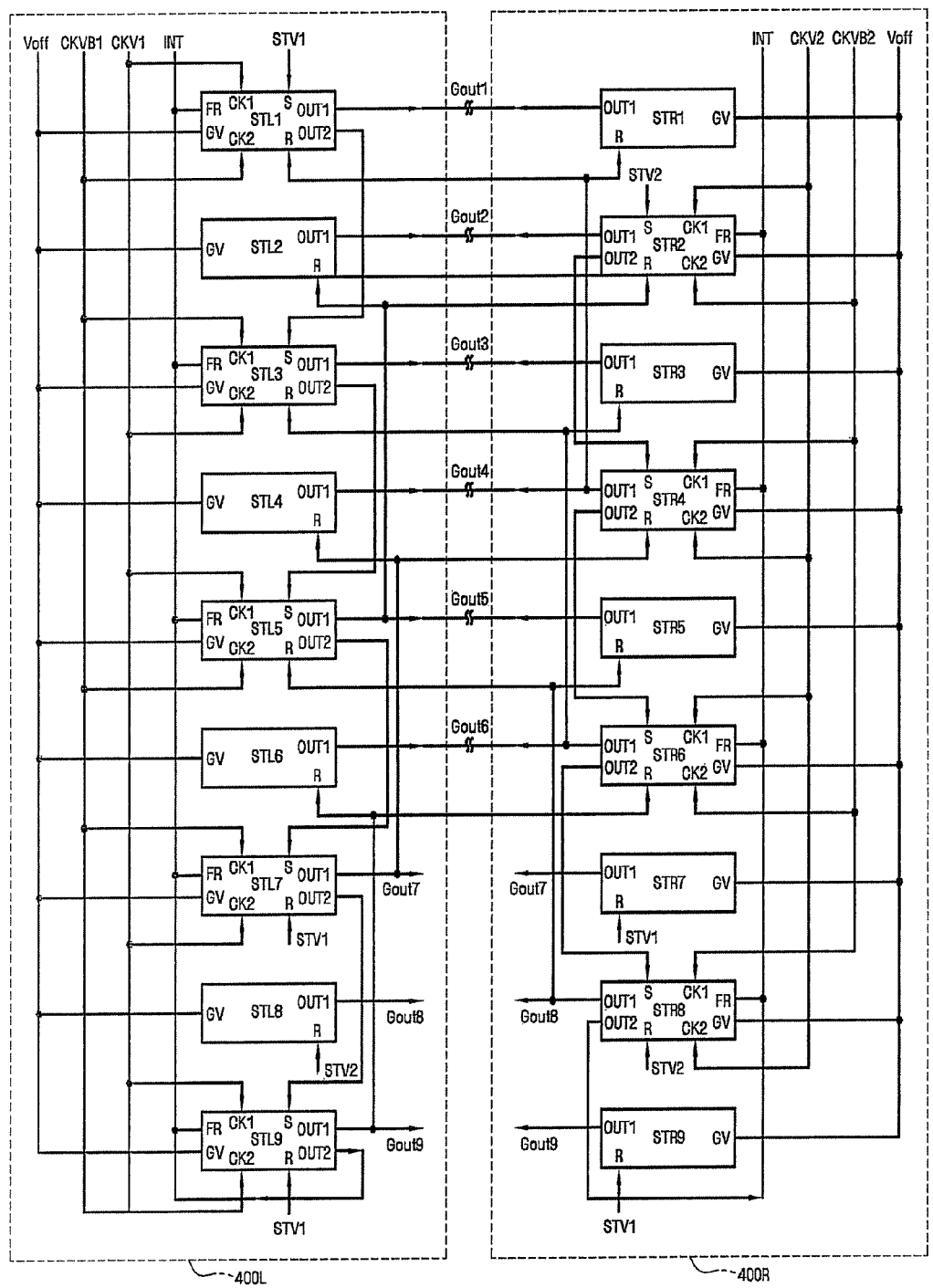

FIGS. 7 and 8 are block diagrams of shift registers of a gate driving circuit according to an alternative exemplary embodiment of the present invention.

Referring to FIGS. 1 and 7, a first shift register 400L is connected to a first end of each gate line of a plurality of gate lines $G_1$ through $G_1$, and a second shift register 400R is connected to a second opposite end of each gate line of the plurality of gate lines $G_1$ through $G_n$. The first shift register 400L and the second shift register 400R are alternately turned on. For example, a gate signal Gout1 supplied to a first gate line $G_1$ is output from the first shift register 400L, and a gate signal Gout2 supplied to a second gate line $G_2$ is then output from the second shift register 400R.

As shown in FIG. 5, the gate signal Gout1 supplied to the first gate line $G_1$ includes a preliminary charging period P1 and a main charging period M1, and the gate signal Gout2 supplied to the second gate line $G_2$ is delayed from the gate signal Gout1 by the preliminary charging period P1.

The first shift register 400L includes a plurality of left stages STL1, STL2, . . . , STL(j) which sequentially output odd-numbered gate signals, and the second shift register 400R includes a plurality of right stages STR1, STR2, . . . , STR(j) which sequentially output even-numbered gate signals. Respective left and right stages with the plurality of left stages STL1, STL2, . . . , STL(j) and the plurality of right stages STR1, STR2, . . . , STR(j), respectively, are cascaded.

Referring to FIG. 7, a plurality of odd-numbered left stages STL1, STL3, STL5 and STL7 and a plurality of even-numbered right stages STR2, STR4, STR6 and STR8 each have a first clock terminal CK1, a second clock terminal CK2, a set terminal S, a reset terminal R, a power voltage terminal GV, a frame reset terminal FR, a gate output terminal OUT1, and a carry output terminal OUT2.

In contrast, a plurality of even-numbered left stages STL2, STL4, STL6 and STL8 and a plurality of odd-numbered right stages STR1, STR3, STR5 and STR7 each have a power voltage terminal GV, a reset terminal R and a gate output terminal OUT1.

As shown in FIG. 7, a first clock signal CKV1, a first inverted clock signal CKVB1 and a gate-off signal Voff are supplied to each stage of the plurality of odd-numbered left stages STL1, STL3, STL5 and STL7, while a first start signal STV1 is applied to an odd-numbered left stage STL1. A second clock signal CKV2, a second inverted clock signal CKVB2 and the gate-off signal Voff are supplied to each stage of the plurality of even-numbered right stages STR2, STR4, STR6 and STR8, while a second start signal STV2 is supplied to an even-numbered right stage STR2.

The first inverted clock signal CKVB1 has a phase which is inverted with respect to a phase of the first clock signal CKV1, and the second inverted clock signal CKVB2 has a phase which is inverted with respect to a phase of the second clock signal CKV2. Further, the second clock signal CKV2 is delayed from the first clock signal CKV1 by one quarter ("T/4") of one period ("T") of the first clock signal CKV1, and the first inverted clock signal CKVB1 is delayed from the second inverted clock signal CKVB2 by one quarter ("T/4") of one period ("T") of the second inverted clock signal CKVB2.

Instead of a carry signal of a previous stage, the first start signal STV1 is input to the set terminal S of the first left stage STL1, and the second start signal STV2 is input to the set terminal S of the second right stage STR2. The second start signal STV2 is delayed from the first start signal STV1 by one quarter ("T/4") of one period ("T") of the first start signal STV1.

The first start signal STV1 is input to reset terminals R of a last left stage STL(j) and a last right stage STR(j).

In each stage of the plurality of odd-numbered left stages STL1, STL3, STL5 and STL7 such as the third left stage STL3, for example, a carry signal of the previous left stage STL1 and a gate signal Gout6 of a subsequent right stage STR6 are input to the set terminal S and the reset terminal R, respectively, of the third left stage STL3, and the first inverted clock signal CKVB1 and the first clock signal CKV1 are input to the first clock terminal CK1 and the second clock terminal CK2, respectively, of the third left stage STL3. In addition, the gate-off signal Voff is input to the power voltage terminal GV, and an initial signal INT is input to the frame reset terminal FR of the third left stage STL3. The gate output terminal OUT1 outputs a gate signal Gout3, and the carry output terminal OUT2 outputs a carry signal Cout3.

The gate signal Gout6 of the subsequent right stage STR6 is simultaneously input to the reset terminal R of the third left stage STL3 and the reset terminal R of the third right stage STR3.

Finally, a carry signal Cout(j) of the last stage STL(j) is supplied to each stage of the plurality of stages STL1, STL2, . . . , STL(j) as the initial signal INT.

For purposes of explanation, a block diagram of a shift register having nine stages, e.g., j=9, is shown in FIG. 8, but alternative exemplary embodiments of the present invention are not limited thereto.

Referring to FIGS. 1 and 8, the odd-numbered left stages STL1, STL3 and STL5, the even-numbered right stages STR2, STR4 and STR6 supply gate signals Gout1 through Gout6 to six gate lines $G_1$ through $G_6$, while left dummy stages STL7, STL8 and STL9, and right dummy stages STR7, STR8, and STR9 supply gate signals Gout7 through Gout9 to the left and right fourth stages STL4 and STR4, the left and right fifth stages STL5 and STR5 and the left and right sixth stages STL6 and STR6, respectively.

The gate signal Gout4 of the right stage STR4 is input to the reset terminal R of the left stage STL1 and the reset terminal R of the right stage STR1. The gate signal Gout6 of the right stage STR6 is input to the reset terminal R of the left stage STL3 and the reset terminal R of the right stage STR3.

The gate signal Gout5 of the left stage STL5 is input to the reset terminal R of the right stage STR2 and the reset terminal R of the left stage STL2. The gate signal Gout7 of the left stage STL7 is input to the reset terminal R of the right stage STR4 and the reset terminal R of the left stage STL4. Therefore, in alternative exemplary embodiments, it is possible to adjust the reset time of each stage by varying stages connected to respective reset terminals R.

Referring to FIGS. 7 and 8, the plurality of odd-numbered left stages of the first shift register 400L and the plurality of even-numbered right stages of the second shift register 400R have substantially the same structure as described in greater detail above with reference to FIGS. 1 through 6. Therefore, the plurality of odd-numbered left stages and the plurality of even-numbered right stages may include the same circuits as shown in FIGS. 4 and 6, and thus any repetitive description thereof will be omitted herein.

The same or like advantages and/or benefits flow from the exemplary embodiment described with reference to FIGS. 7 and 8 as for the alternate exemplary embodiments of the present invention previously described above.

As described above in greater detail, in a gate driving circuit and a liquid crystal display including the same according to exemplary embodiments of the present invention, an aspect ratio of a transistor in the gate driving circuit may be reduced, thereby effectively reducing a size of the gate driving circuit and providing an improved production margin and resulting improvement in production efficiency and reduction in production costs of the gate driving circuit and the liquid crystal panel having the same.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A gate driving circuit comprising a plurality of stages, wherein at least a first stage of the plurality of stages comprises:
    a first node and a second node;
    a pull-up driving unit which receives a first carry signal from a second stage of the plurality of stages or a start signal and outputs a control signal to the first node, the control signal having:
    a first voltage level during a preliminary period,
    a second voltage level higher than the first voltage level during a gate active period subsequent and adjacent to the preliminary period,
    a third voltage level lower than the second voltage level during a first gate inactive period subsequent and adjacent to the gate active period, and
    a fourth voltage level lower than the third voltage level during a second gate inactive period subsequent and adjacent to the first gate inactive period;
    a pull-up unit which receives the control signal and a clock signal and outputs a gate-on signal to the second node during the first gate active period;
    a carry output unit which receives the control signal and the clock signal and outputs a second carry signal to a third stage during the first gate active period; and
    a pull-down unit which receives a gate-off signal and the first carry signal from the second stage and outputs the control signal having the fourth voltage level to the first node during the second gate inactive period,
    wherein the gate circuit of a plurality of shift registers further comprises a first dummy stage, a second dummy stage and a third dummy stage, which receive the start signal.

2. The gate driving circuit of claim 1, wherein the pull-up unit comprises a first switching element which outputs a gate-on signal pulled up by the clock signal to the second node in response to the control signal.

3. The gate driving circuit of claim 2, wherein the pull-down unit consists of a second switching element which receives the first carry signal from the second stage and pulls down a voltage level of the first node.

4. The gate driving circuit of claim 2, wherein the pull-down unit comprises:
    a second switching element which receives the first carry signal from the second stage and pulls down a voltage level of the first node; and
    a third switching element which receives the first carry signal from the second stage and pulls down the voltage level of the second node.

5. The gate driving circuit of claim 1, further comprising:
    a first shift register and a second shift register of the plurality of shift registers, each comprising a first stage, a second stage, a third stage and a fourth stage corresponding to a first gate line, a second gate line, a third gate line and a fourth gate line, respectively,
    wherein the first stage, the second stage, the third stage and the fourth stage of each of the first shift register and the second shift register sequentially supply a first gate-on signal, a second gate-on signal, a third gate-on signal and a fourth gate-on signal, respectively, to the first gate line, the second gate line, the third gate line and the fourth gate line, respectively, and
    the first stage of each of the first shift register and the second shift register receives the fourth gate-on signal output from the fourth stage of each of the first shift register and the second shift register and outputs a first gate-off signal to the first gate line.

6. The gate driving circuit of claim 5, wherein:
    the first gate-on signal of each of the first shift register and the second shift register includes a preliminary charging period and a main charging period, and
    an application time of the second gate-on signal of each of the first shift register and the second shift register is delayed from an application time of the first gate-on signal of each of the first shift register and the second shift register by the preliminary charging period.

7. The gate driving circuit of claim 5, wherein:
    the first shift register is arranged in a substantially vertical direction and is disposed on a first side of an area having the first gate line, the second gate line, the third gate line and the fourth gate line disposed thereon, and
    the second shift register is arranged in the substantially vertical direction and is disposed on a second opposite side of the area having the first gate line, the second gate line, the third gate line and the fourth gate line disposed thereon.

8. The gate driving circuit of claim 7, wherein the first shift register and the second shift register are simultaneously turned on.

9. The gate driving circuit of claim 8, wherein the first shift register and the second shift register each further comprise the first dummy stage, the second dummy stage and the third dummy stage.

10. The gate driving circuit of claim 7 wherein the first shift register and the second shift register are sequentially turned on.

11. The gate driving circuit of claim 5, further comprising:
    a first shift register having a first stage corresponding to a first gate line and a third stage corresponding to a third gate line; and
    a second shift register having a second stage corresponding to a second gate line and a fourth stage corresponding to a fourth gate line,
    wherein the first stage, the second stage, the third stage and the fourth stage sequentially supply a first gate-on signal, a second gate-on signal, a third gate-on signal and a fourth gate-on signal, respectively, to the first gate line, the second gate line, the third gate line and the fourth gate line, respectively, and
    the first stage receives the fourth gate-on signal output from the fourth stage and outputs a first gate-off signal to the first gate line,
    the first shift register is arranged in a substantially vertical direction and is disposed on a first side of an area having the first gate line, the second gate line, the third gate line and the fourth gate line disposed thereon, the second shift register is arranged in the substantially vertical direction and is disposed on a second opposite side of the area having the first gate line, the second gate line, the third gate line and the fourth gate line disposed thereon, and the first shift register and the second shift register are sequentially turned on.

12. A liquid crystal display comprising:
a liquid crystal panel comprising first through n-th gate lines (where n is a natural number) and first through m-th data lines (where m is a natural number);
a gate driving circuit comprising first through n-th stages corresponding to the first through n-th gate lines, respectively, and (n+1)-th through (n+3)-th stages not corresponding to any gate lines; and
a data driving circuit which supplies a data voltage to the first through m-th data lines,
wherein the first through (n+3)-th stages sequentially supply first through (n+3)-th gate-on signals,
an i-th stage (where $1 \leq i \leq n$) of the gate driving circuit receives a gate-on signal output from an (i+3)-th stage of the gate driving circuit and supplies a gate-off signal to the first gate line of the liquid crystal panel, and the first and (n+1)-th through (n+3)-th stages receive a same start signal.

13. A liquid crystal display comprising:
a liquid crystal panel comprising
a first gate line, a second gate line, a third gate line and a fourth gate line;
a first data line, a second data line, a third data line and a fourth data line; and
pixels disposed at intersections of respective gate lines of the first gate line, the second gate line, the third gate line and the fourth gate line and respective data lines of the first data line, the second data line, the third data line and the fourth data line;
a gate driving circuit comprising a first shift register disposed at a first side of each of the first gate line, the second gate line, the third gate line and the fourth gate line, and a second shift register disposed at a second opposite side of each of the first gate line, the second gate line, the third gate line and the fourth gate line, the first shift register and the second shift register each having a first stage, a second stage, a third stage and a fourth stage corresponding to the first gate line, the second gate line, the third gate line and the fourth gate line, respectively; and
a data driving circuit which supplies a data voltage to the first data line, the second data line, the third data line and the fourth data line,
wherein the first stage, the second stage, the third stage and the fourth stage of each of the first shift register and the second shift register sequentially supply a first gate-on signal, a second gate-on signal, a third gate-on signal and a fourth gate-on signal to the first gate line, the second gate line, the third gate line and the fourth gate line, respectively, and
the first stage of each of the first shift register and the second shift register receives the fourth gate-on signal output from the fourth stage of each of the first shift register and the second shift register and outputs a first gate-off signal to the first gate line,
wherein
the first shift register is arranged in a substantially vertical direction and is disposed on a first side of an area having the first gate line, the second gate line, the third gate line and the fourth gate line disposed thereon, and
the second shift register is arranged in the substantially vertical direction and is disposed on a second opposite side of the area having the first gate line, the second gate line, the third gate line and the fourth gate line disposed thereon.

14. The liquid crystal display of claim 13, wherein the first shift register and the second shift register are simultaneously turned on.

15. The liquid crystal display of claim 13, wherein the first shift register and the second shift register are sequentially turned on.

16. A liquid crystal display comprising:
a liquid crystal panel comprising first through n-th gate lines (where n is a natural number) and first through m-th data lines (where m is a natural number);
a gate driving circuit comprising a plurality of stages;
a data driving circuit which supplies a data voltage to the first through m-th data lines,
wherein at least a first stage of the plurality of stages comprises:
a first node and a second node;
a pull-up driving unit which receives a first carry signal from a second stage or a start signal and outputs a control signal to the first node, the control signal having:
a first voltage level during a preliminary period,
a second voltage level higher than the first voltage level during a gate active period subsequent and adjacent to the preliminary period,
a third voltage level lower than the second voltage level during a first gate inactive period subsequent and adjacent to the gate active period, and
a fourth voltage level lower than the third voltage level during a second gate inactive period subsequent and adjacent to the first gate inactive period;
a pull-up unit which receives the control signal and a clock signal and outputs a gate-on signal to the second node during the first gate active period;
a carry output unit which receives the control signal and the clock signal and outputs a second carry signal to a third stage during the first gate active period; and
a pull-down unit which receives a gate-off signal and the first carry signal from the second stage and outputs the control signal having the fourth voltage level to the first node during the second gate inactive period,
wherein the gate circuit of a plurality of shift registers further comprises a first dummy stage, a second dummy stage and a third dummy stage, which receive the start signal.

17. The liquid crystal display of claim 16, wherein the pull-up unit comprises a first switching element which outputs a gate-on signal pulled up by the clock signal to the second node in response to the control signal.

18. The liquid crystal display of claim 17, wherein the pull-down unit consists of a second switching element which receives the first carry signal from the second stage and pulls down a voltage level of the first node.

19. The liquid crystal display of claim 17, wherein:
the pull-down unit comprises:
a second switching element which receives the first carry signal from the second stage and pulls down a voltage level of the first node; and
a third switching element which receives the first carry signal from the second stage and pulls down the voltage level of the second node.

* * * * *